US012676623B2

(12) United States Patent
Tang et al.

(10) Patent No.: US 12,676,623 B2
(45) Date of Patent: Jul. 7, 2026

(54) TOUCH CHIP, TOUCH CONTROL TESTING METHOD AND ELECTRONIC DEVICE

(71) Applicant: Wuhan Tianma Micro-Electronics Co., Ltd., Wuhan (CN)

(72) Inventors: Lu Tang, Wuhan (CN); Ye Huang, Wuhan (CN); Xigang Liu, Wuhan (CN); Zhihua Yu, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 2 days.

(21) Appl. No.: 18/676,109

(22) Filed: May 28, 2024

(65) Prior Publication Data

US 2025/0293700 A1 Sep. 18, 2025

(30) Foreign Application Priority Data

Mar. 12, 2024 (CN) .......................... 202410284973.6

(51) Int. Cl.
*H03M 1/06* (2006.01)
*G06F 3/041* (2006.01)
*G09G 3/00* (2006.01)

(52) U.S. Cl.
CPC ...... *H03M 1/0626* (2013.01); *G06F 3/04182* (2019.05); *G09G 3/006* (2013.01)

(58) Field of Classification Search
None
See application file for complete search history.

(56) References Cited

U.S. PATENT DOCUMENTS

| | | | | |
|---|---|---|---|---|
| 2010/0245286 A1* | 9/2010 | Parker | ................. | G06F 3/04883 |
| | | | | 345/174 |
| 2011/0084857 A1* | 4/2011 | Marino | ................. | G06F 3/0446 |
| | | | | 341/5 |
| 2013/0221993 A1* | 8/2013 | Ksondzyk | ............ | H03K 17/955 |
| | | | | 324/681 |
| 2014/0240256 A1* | 8/2014 | Kim | ...................... | G06F 3/0412 |
| | | | | 345/173 |
| 2014/0267129 A1* | 9/2014 | Rebeschi | ........... | H03K 17/9622 |
| | | | | 345/174 |
| 2015/0338952 A1* | 11/2015 | Shahparnia | ........... | G06F 3/0443 |
| | | | | 345/174 |
| 2019/0310755 A1* | 10/2019 | Sasaki | ..................... | G06F 3/044 |
| 2023/0050409 A1* | 2/2023 | Lee | .......................... | G09G 3/20 |
| 2023/0086110 A1* | 3/2023 | Winokur | ............ | G06F 3/04182 |
| | | | | 345/173 |

FOREIGN PATENT DOCUMENTS

| | | | | | |
|---|---|---|---|---|---|
| CN | 111813271 B | * | 5/2021 | ............. | G06F 3/044 |
| CN | 117687533 A | * | 3/2024 | ............. | G06N 3/096 |
| KR | 102280434 B1 | * | 7/2021 | ........... | G06F 3/0416 |
| TW | 202248803 A | * | 12/2022 | | |

* cited by examiner

*Primary Examiner* — Kirk W Hermann
(74) *Attorney, Agent, or Firm* — Anova Law Group, PLLC

(57) ABSTRACT
A touch chip is applied to a touch display panel including a plurality of touch-sensing channels. The touch chip includes a plurality of analog-to-digital conversion circuits electrically connected to the plurality of touch-sensing channels of the touch display panel in one-to-one correspondence.

14 Claims, 6 Drawing Sheets

TOUCH CHIP, TOUCH CONTROL TESTING METHOD AND ELECTRONIC DEVICE

CROSS-REFERENCE TO RELATED APPLICATION

This application claims the priority of Chinese Patent Application No. 202410284973.6, filed on Mar. 12, 2024, the content of which is incorporated by reference in its entirety.

TECHNICAL FIELD

The present disclosure generally relates to the field of touch control technologies and, more particularly, relates to a touch chip, a touch control testing method and an electronic device.

BACKGROUND

Touch chip (TP IC) is an important chip for detecting the human-computer interaction in life. Through the touch chip, people can directly operate terminal electronic products.

With the rapid development of terminal products, their functions are becoming more and more abundant. For example, a mobile phone not only provides the function of making calls, but also provides functions such as shopping and playing games. These new functions have very strict requirements on accuracy, thus the performance requirements for touch chips are also becoming more stringent. For example, touch chips are required to overcome interference from various noises. Therefore, there is a need to optimize the noise reduction capability of the touch chip. The present disclosed touch chips, touch control testing methods and electronic devices are directed to solve such a problem and other problems in the arts.

SUMMARY

One aspect of the present disclosure provides a touch chip. The touch chip is applied to a touch display panel including a plurality of touch-sensing channels, and includes a plurality of analog-to-digital conversion circuits electrically connected to the plurality of touch-sensing channels of the touch display panel in one-to-one correspondence.

Another aspect of the present disclosure includes a method for testing a touch chip. The method includes providing a touch chip including a plurality of analog-to-digital conversion circuits electrically connected to a plurality of touch-sensing channels of a touch display panel in one-to-one correspondence; acquiring original noise data corresponding to a touch-sensing channel of the plurality of touch-sensing channels that is electrically connected to each of the plurality of analog-to-digital conversion circuits using each of the plurality of analog-to-digital conversion circuits; and setting filter parameters corresponding to each of the plurality of touch-sensing channels according to the original noise data corresponding to each of the plurality of touch-sensing channels.

Another aspect of the present disclosure includes an electronic device. The electronic device includes a touch display panel; and a touch chip including a plurality of analog-to-digital conversion circuits electrically connected to a plurality of touch-sensing channels of the touch display panel in one-to-one correspondence.

Other aspects of the present disclosure can be understood by those skilled in the art in light of the description, the claims, and the drawings of the present disclosure.

BRIEF DESCRIPTION OF THE DRAWINGS

To illustrate the technical solutions in the embodiments of the present disclosure more clearly, the following briefly introduces the accompanying drawings used in the description of the embodiments. Obviously, the accompanying drawings in the following description are only some embodiments of the present disclosure, for those of ordinary skill in the art, other drawings can also be obtained from these drawings without creative effort.

DETAILED DESCRIPTION

Figure 1:
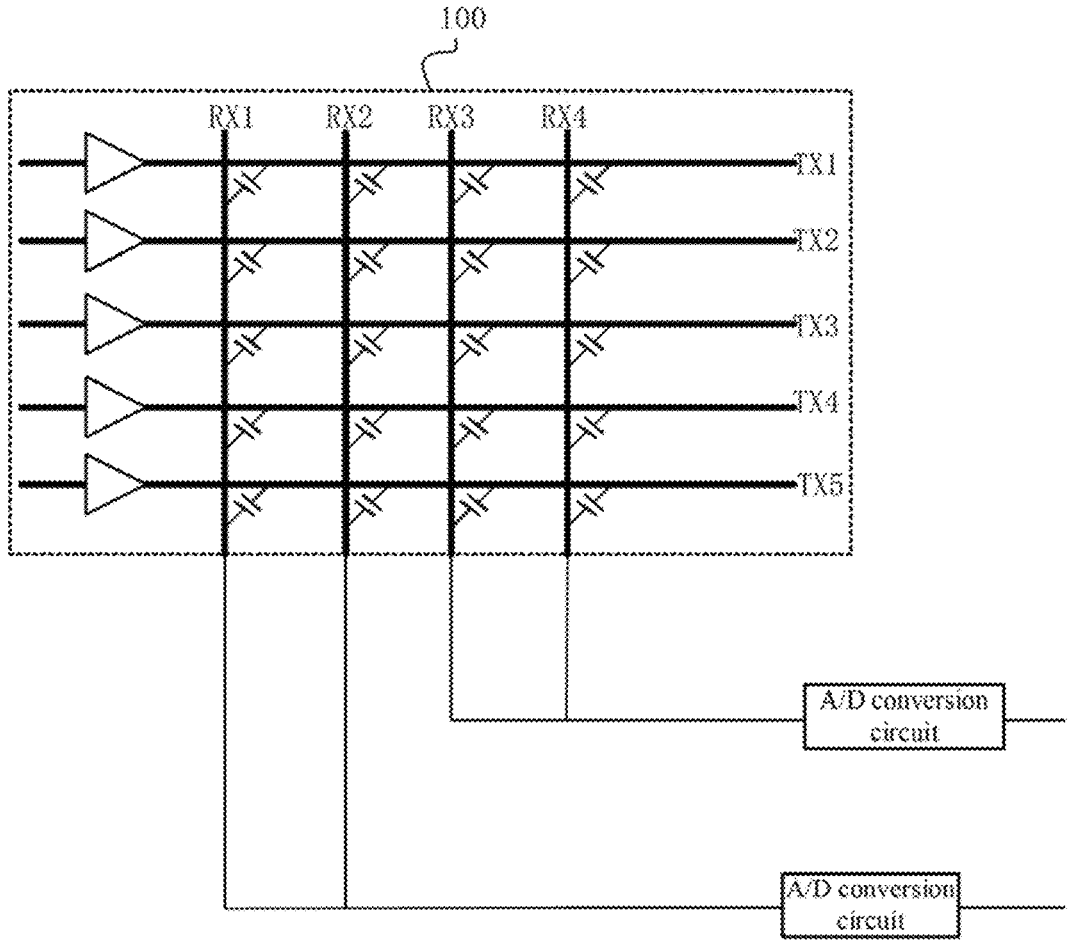
FIG. 1 illustrates an exemplary touch chip.

Features and exemplary embodiments of various aspects of the present disclosure will be described in detail below. To make the purpose, technical solutions and advantages of the present disclosure clearer, the present disclosure will be described in further detail below with reference to the accompanying drawings and specific embodiments. It should be understood that the specific embodiments described herein are only configured to explain the present disclosure and are not configured to limit the present disclosure. It will be apparent to one skilled in the art that the present disclosure may be practiced without some of these specific details. The following description of embodiments is merely intended to provide a better understanding of the present disclosure by illustrating examples thereof.

It should be noted that in this disclosure, relational terms such as first and second are only used to distinguish one entity or operation from another entity or operation, and do not necessarily require or imply that these entities or operations have any such actual relationship or sequence exists between them. Furthermore, the terms "comprises", "comprise of" or any other variations thereof are intended to cover a non-exclusive inclusion such that a process, method, article, or apparatus that includes a list of elements includes not only those elements, but also those not expressly listed other elements, or elements inherent to the process, method, article or equipment. Without further limitation, an element defined by the statement "comprising . . . " does not exclude the presence of additional identical elements in a process, method, article, or device that includes the stated element.

It will be understood that when describing the structure of components, when one layer or region is referred to as being "on" or "over" another layer or region, it can mean being directly on the other layer or region, or there are other layers or areas between it and another layer, or another area. And if the part is turned over, that layer or the area, will be "under" or "below" another layer, or area.

It should be understood that the term "and/or" used in this disclosure is only an association relationship describing related objects, indicating that there can be three relationships, for example, A and/or B, which can mean A alone exists, and A and B exist simultaneously, and B alone. In addition, the character "/" in this article generally indicates that the related objects are an "or" relationship.

In the embodiments of this disclosure, the term "electrical connection" may refer to a direct electrical connection between two components, or may refer to an electrical connection between two components via one or more other components.

It will be apparent to those skilled in the art that various modifications and changes can be made in this disclosure without departing from the spirit or scope of the disclosure. Thus, this disclosure is intended to cover the modifications and variations of this disclosure provided within the scope of the corresponding claims (claimed technical solutions) and their equivalents. It should be noted that the implementation modes provided in the embodiments of this disclosure may be combined with each other if there is no contradiction.

A display panel with a touch function may be referred to as a touch display panel. As shown in FIG. 1, the touch display panel 100 may be a mutual capacitive touch structure. The touch display panel 100 may be provided with a touch-sensing channel RX and a touch-control channel TX. FIG. 1 exemplarily illustrates four touch-sensing channels RX1-RX4 and five touch-driving channels TX1-TX5. The touch-sensing channel RX and the touch-driving channel TX cross each other to form a mutual capacitor. The touch chip 200 sends a driving signal to the touch-driving channel TX and collects the sensing signal of the touch-sensing channel RX to realize the recognition of the touch position.

As a comparison, as shown in FIG. 1, multiple touch-sensing channels RX share an analog-to-digital conversion circuit ADC of the touch chip. In such a configuration, when debugging the firmware (FW), it is impossible to separately capture the noise data of each touch-sensing channel RX, and when the touch chip filters, the filtering parameters of each touch-sensing channel RX cannot be set independently.

Figure 2:
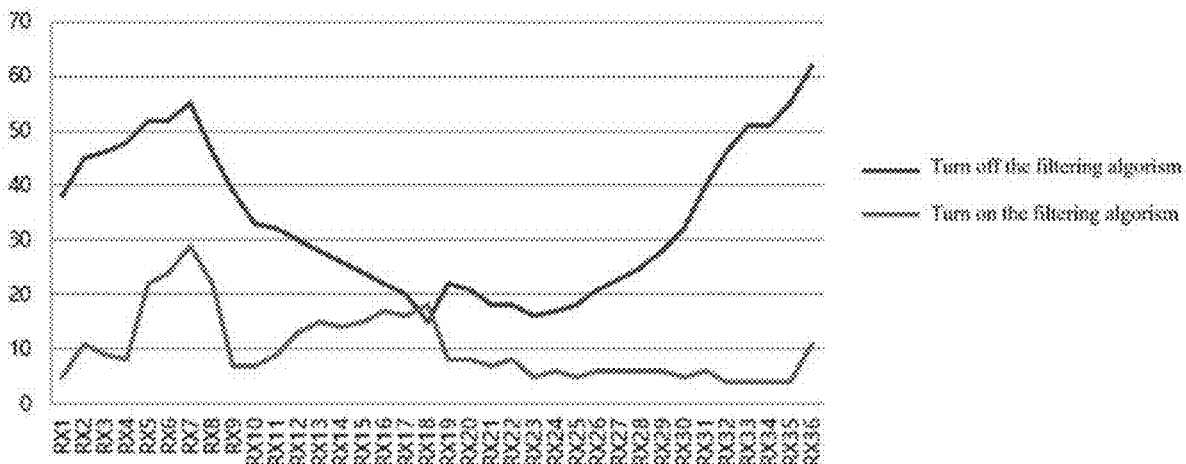
FIG. 2 illustrates a comparison of noises.

However, for the same touch display panel, as shown in FIG. 2, the original noise data of different touch-sensing channels RX (the noise data when the touch chip turns off the noise filtering algorithm) are different, and there are even large differences in the original noise data of some touch-sensing channels RX. In such a way, after the noise of touch-sensing channels RX of the touch chip is filtered, the noise level of some touch-sensing channels RX is still too large. For this portion of touch-sensing channels RX, it cannot achieve a desired filtering effect.

To solve the above technical problems, the present disclosure provides a touch chip, a touch control testing method, and an electronic device. The embodiments of the present disclosure are described in detail below with reference to the accompanying drawings.

Figure 3:
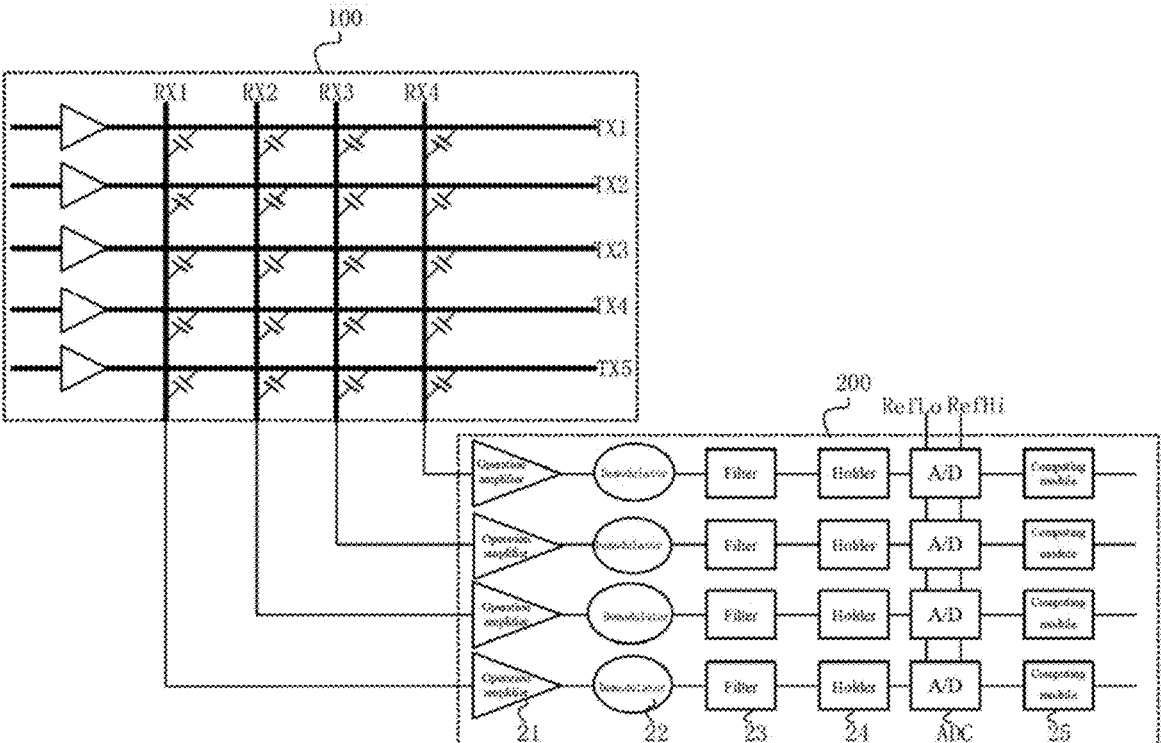
FIG. 3 illustrates an exemplary touch chip according to various disclosed embodiments of the present disclosure.

FIG. 3 illustrates an exemplary touch chip according to various disclosed embodiments of the present disclosure. As shown in FIG. 3, the touch chip 200 provided by the embodiment of the present disclosure may be applied to a touch display panel 100, and the touch display panel 100 may be provided with touch-sensing channels RX and touch-driving channels TX. FIG. 3 exemplarily shows four touch-sensing channels RX1-RX4 and five touch-driving channels TX1-TX5. The number of touch-sensing channels RX and touch-driving channels TX shown in FIG. 3 is not limited to the present disclosure.

In one embodiment, the touch display panel 200 may be an organic light-emitting diode (OLED) display panel, a liquid crystal display (LCD) panel, a micro light-emitting diode (Micro LED) display panel, a quantum dot display panel, or other types of display panels. The type of the display panel is not limited in the present disclosure.

The touch chip 200 may include a plurality of analog-to-digital conversion circuits ADC, and the plurality of analog-to-digital conversion circuits ADC and the plurality of touch-sensing channels RX may be electrically connected in a one-to-one correspondence. For example, when the touch display panel 100 includes 100 touch sensing-channels RX, the touch chip 200 may also include 100 analog-to-digital conversion circuits ADC such that each touch-sensing channel RX is independently configured with an analog-to-digital conversion circuit ADC. The analog-to-digital conversion circuit ADC may convert the collected analog signals into data signals.

In one embodiment, as shown in FIG. 3, multiple analog-to-digital conversion circuits ADC may be electrically connected to a same low reference level RefLo, and/or multiple analog-to-digital conversion circuits ADC may be electrically connected to a same high reference level RefHi. It should be noted that this disclosure does not limit the specific structure of the analog-to-digital conversion circuit ADC.

According to the embodiments of the present disclosure, each touch-sensing channel RX may correspond to an analog-to-digital conversion circuit ADC. In such a configuration, the original noise data corresponding to each touch-sensing channel RX may be separately collected during the FW debugging such that the touch chip may set the corresponding filter parameters for each touch-sensing channel RX according to the original noise data corresponding to each touch-sensing channel RX. Thus, a better filtering effect may be achieved for each touch-sensing channel RX. Therefore, the noise reduction capability of the touch chip may be optimized.

The implementation details of the touch chip in this embodiment are described in detail below. The following content is only provided for the convenience of understanding and is not necessary to implement this solution.

In one embodiment, the analog-to-digital conversion circuit ADC may have a filtering function, and the analog-to-digital conversion circuit ADC may filter the data of its corresponding touch-sensing channel RX according to the set filter parameters.

When collecting the original noise data corresponding to the touch-sensing channel RX, the filtering function of the analog-to-digital conversion circuit ADC may be turned off. When it is necessary to filter noise data, the filtering function of the analog-to-digital conversion circuit ADC may be turned on.

Figure 4:
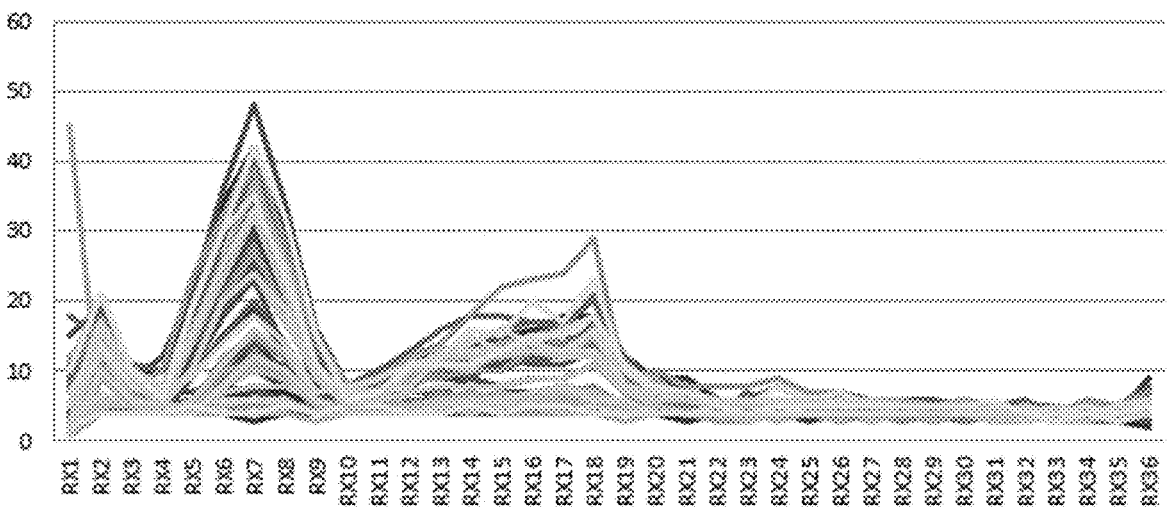
FIG. 4 illustrates an exemplary comparison of noises according to various disclosed embodiments of the present disclosure.

The filtering parameters for different panels in the firmware (FW) settings may be fixed. For example, all panels in the same project may share the filtering parameters. However, as shown in FIG. 4, where different lines represent different panels, there may be differences in the original noise data of different panels. When the two panels share filtering parameters, the noise of some products after being filtered by the touch chip may be still too large, which may affect the production line yield and the touch performance of the entire device.

Figure 5:
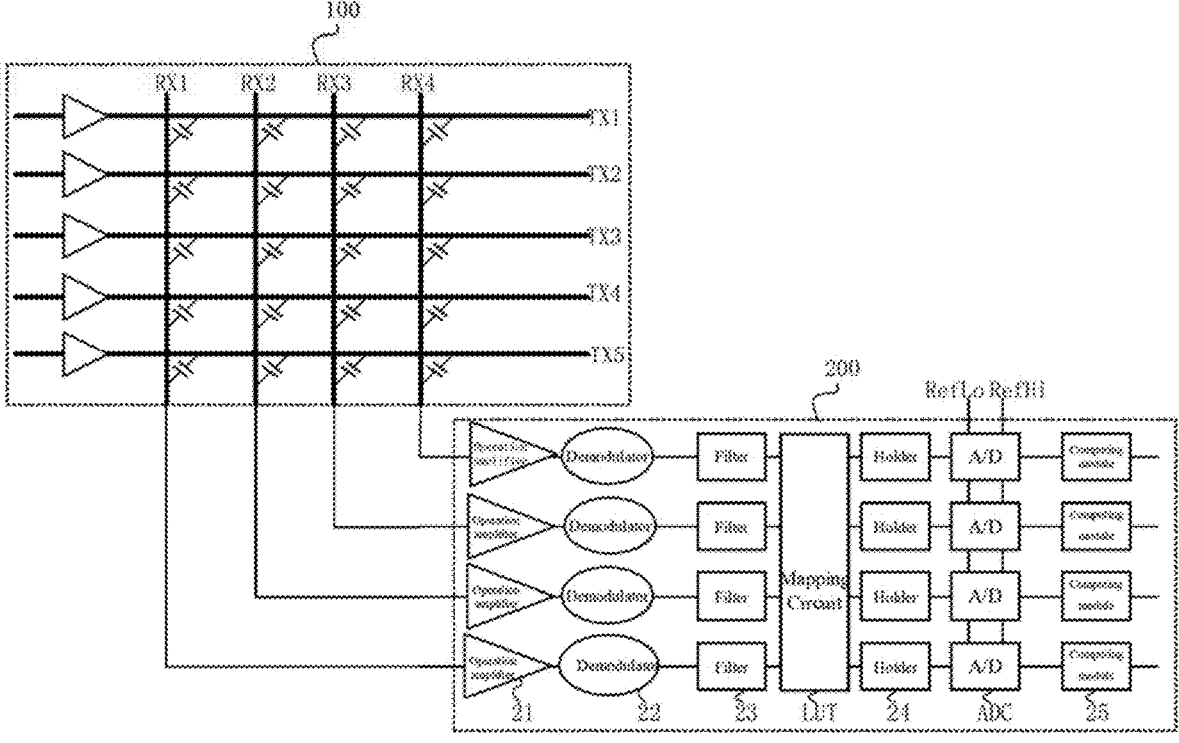
FIG. 5 illustrates another exemplary touch chip according to various disclosed embodiments of the present disclosure.

To solve the above technical problem, as shown in FIG. 5, the touch chip 200 may further include a mapping circuit LUT, and the mapping circuit LUT may be electrically connected between the analog-to-digital conversion circuit ADC and the touch-sensing channel RX. The mapping circuit LUT may include mapping relationships between a plurality of original noise data and a plurality of filtering parameters.

The input of the mapping circuit LUT may be the original noise data, and the output may be the filtering parameters. When the original noise data is different, the filtering parameters may be different. It should be noted that this disclosure does not limit the specific structure of the mapping circuit LUT.

According to the embodiments of the present disclosure, by adding the mapping circuit LUT, the hardware conditions for mapping between original noise data and filtering parameters may be established. In such a configuration, when performing the FW debugging, the touch chip may set the corresponding filtering parameters for each touch display panel based on the original noise data corresponding to each touch display panel such that a better filtering effect may be achieved for each touch display panel, which may facilitate improving the production line yield and the touch control performance of the entire device.

There may be differences in the original noise data of different panels, especially the differences in the original noise data of panels under different working conditions may be significantly large. For example, a same touch display panel may support multiple refresh frequencies. The refresh frequency may refer to the refresh frequency of the display screen. For example, when the touch display panel is used to display game pictures, the touch display panel may refresh the screen at 120 Hz. When the touch display panel is used to display the text information, the touch display panel may refresh at a frequency of 30 Hz or even lower. However, the original noise data of a touch display panel with a low refresh frequency may be larger than the original noise data of a touch display panel with a high refresh frequency.

In some embodiments, the mapping circuit LUT may be configured to generate filtering parameters corresponding to the touch display panels under different operation conditions based on the original noise data corresponding to the touch display panels under different operating conditions.

According to the embodiments of the present disclosure, a mapping circuit LUT may be introduced, and the mapping circuit LUT may generate filtering parameters corresponding to the touch display panels under different working conditions based on the corresponding original noise data of the touch display panels under different working conditions, when performing the FW debugging, the touch chip may set its corresponding filter parameters for different working conditions based on the original noise data corresponding to the touch display panels under different working conditions. Accordingly, a better filtering performance may be achieved for each working condition. The desired filtering effect may help improve the production line yield and the touch performance of the entire device.

In some embodiments, the corresponding filter parameters of the same touch-sensing channel RX may be different under different working conditions. Because the original noise data corresponding to the same touch-sensing channel RX may be different under different working conditions, if the same filtering parameters are used to filter the same touch-sensing channel RX under different working conditions, the filtering effect may be poor under some working conditions, and the optimality may not be achieved. In the embodiment of the present disclosure, if the same touch-sensing channel RX may have different filtering parameters under different working conditions, different filtering parameters may be used to filter the same touch-sensing channel RX under different working conditions, which may enable the same touch-sensing channel RX to achieve an optimal filtering effect under every working condition.

In one embodiment, the different working conditions in this disclosure may include working conditions in which the refresh frequency of the display screen of the touch display panel is different. Of course, according to actual needs, different working conditions may also refer to working conditions with different brightness of the touch display panel or other working conditions.

In some embodiments, as shown in FIG. 5, multiple touch-sensing channels RX and multiple analog-to-digital conversion circuits ADC may share a mapping circuit LUT. For example, multiple touch-sensing channels RX and multiple analog-to-digital conversion circuits ADC may be electrically connected to the same mapping circuit LUT.

In one embodiment, because multiple touch-sensing channels RX and multiple analog-to-digital conversion circuits ADC may need to correspond one to one, multiple touch-sensing channels RX may be connected to the mapping circuit LUT through different connection lines, and multiple analog-to-digital conversion circuits ADC may be connected to the mapping circuit LUT through different connection lines.

Figure 6:
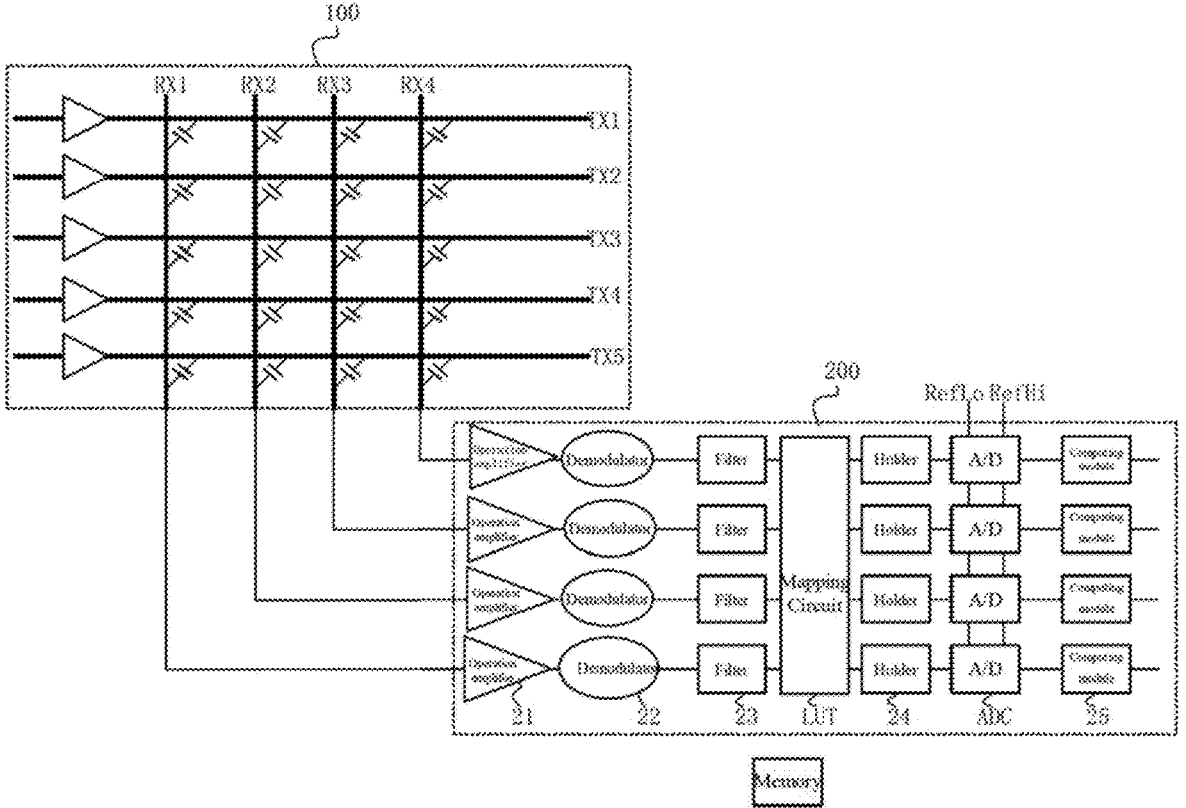
FIG. 6 illustrates another exemplary touch chip according to various disclosed embodiments of the present disclosure.

In some embodiments, as shown in FIG. 6, the touch chip may also include a memory, and the memory may be a flash memory. The memory may be used to store filtering parameters corresponding to each touch-sensing channel. The generated filtering parameters corresponding to each touch-sensing channel may be burned into the flash memory for FW to call.

In some embodiments, as shown in FIG. 5 or FIG. 6, the touch chip 200 may also include an operation amplifier circuit 21, a demodulator 22, a filter 23, and a holder 24.

The input terminal of the operation amplifier circuit 21 may be electrically connected to the touch-sensing channel RX, and the operation amplifier circuit 21 may be configured to convert the current signal from the touch-sensing channel RX into a voltage signal. The plurality of operation amplifier circuits 21 may be electrically connected to the plurality of touch-sensing channels RX in a one-to-one correspondence.

The input terminal of the demodulator 22 may be electrically connected to the output terminal of the operation amplifier circuit 21. The demodulator 22 may be configured to restore the low-frequency digital signal modulated in the high-frequency digital signal. The plurality of demodulators 22 may be electrically connected to the plurality of operation amplifier circuits 21 in one-to-one correspondence.

The input terminal of the filter 23 may be electrically connected to the output terminal of the demodulator 22 for filtering the signal. The plurality of filters 23 and the plurality of demodulators 22 may be electrically connected in one-to-one correspondence. The filter 23 may be configured to perform the hardware filtering, which may be mainly used for preliminary overall filtering.

The input terminal of the holder 24 may be electrically connected to the output terminal of the filter 23, and the output terminal of the holder 24 may be electrically connected to the input terminal of the analog-to-digital conversion circuit ADC. The holder 24 may be used to control its output signal to follow the analog input voltage. During the sampling process of the analog-to-digital conversion circuit ADC, the output of the holder 24 may follow the change of the analog input voltage. In the holding state, the output of the holder 24 may hold the analog input value at the time when the command is issued until the hold command is canceled (that is, the sampling command is received again). At this time, the output of the holder 24 may re-track the input signal change until the next hold command arrives.

In one embodiment, as shown in FIG. 6, the touch chip 200 may also include a computing module 25. The input terminal of the computing module 25 may be electrically connected to the output terminal of the analog-to-digital conversion circuit ADC. The computing module 25 may include an algorithm. The computing module 25 may be configured to convert the digital signal output by the analog-to-digital conversion circuit ADC into the test value of raw data (Raw data) through the algorithm. The touch chip may detect and identify the touch position based on the test value of the raw data.

Figure 7:
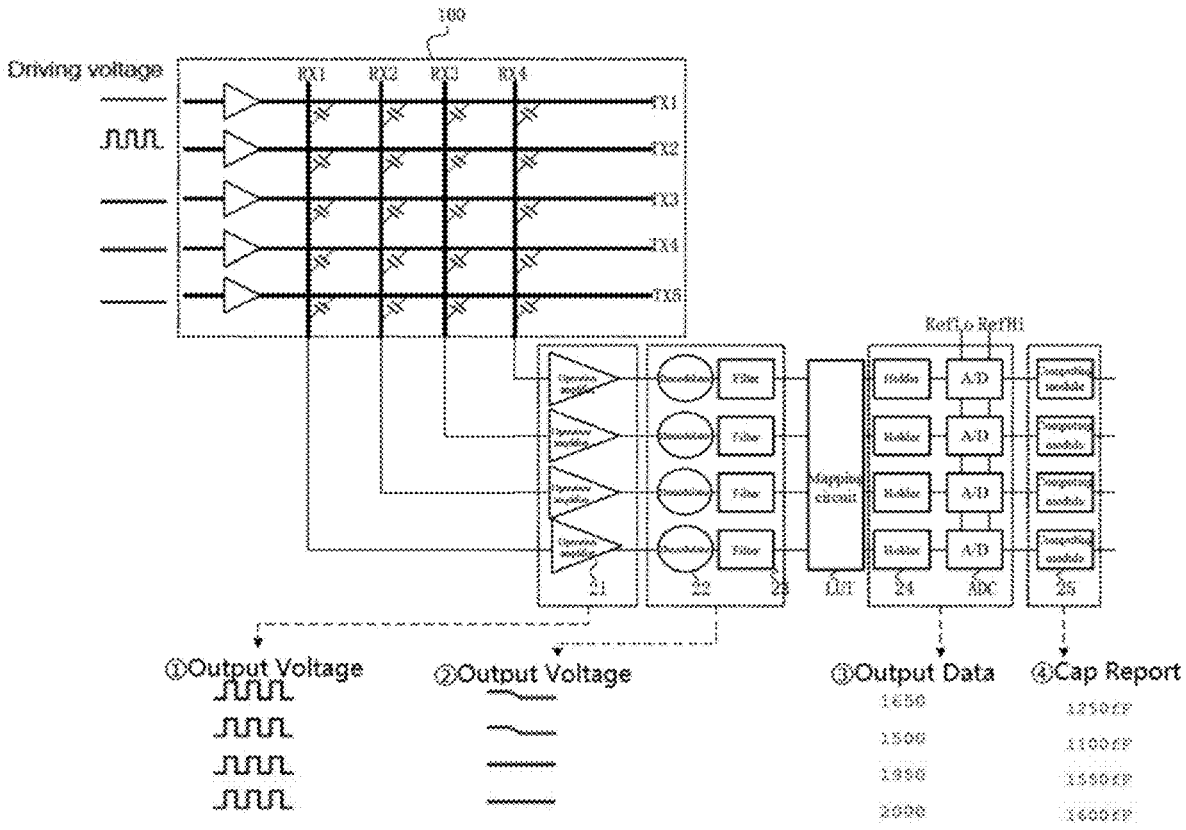
FIG. 7 illustrates another exemplary touch chip according to various disclosed embodiments of the present disclosure.

To clearly illustrate the output signals processed by each module in the touch chip, referring to FIG. 7, after being processed by the operation amplifier 21, the operation amplifier 21 may output a voltage signal. After being processed by the demodulator 22 and the filter 23 in sequence, the filter 23 may output the voltage signal. After being processed by the holder 24 and the analog-to-digital conversion circuit ADC in sequence, the analog-to-digital conversion circuit ADC may output a digital signal. After being processed by the computing module 25, the test data representing the capacitance value may be output. It should be noted that FIG. 7 takes four touch-sensing channels as an example and shows signals on four signal paths. The signals on different paths may be different.

In some embodiments, in the case where the touch chip includes a mapping circuit LUT, the mapping circuit LUT may be electrically connected between the filter 23 and the holder 24. The mapping circuit LUT may map the filtering parameters corresponding to the touch-sensing channel based on the original noise data corresponding to the touch-sensing channel, and then the analog-to-digital conversion circuit ADC may filter the data of the touch-sensing channel based on the mapped filtering parameters.

The present disclosure also provides a touch control testing method. The touch control testing method may be applied to the touch chip described in any of the above embodiments, or other touch chips.

Figure 8:
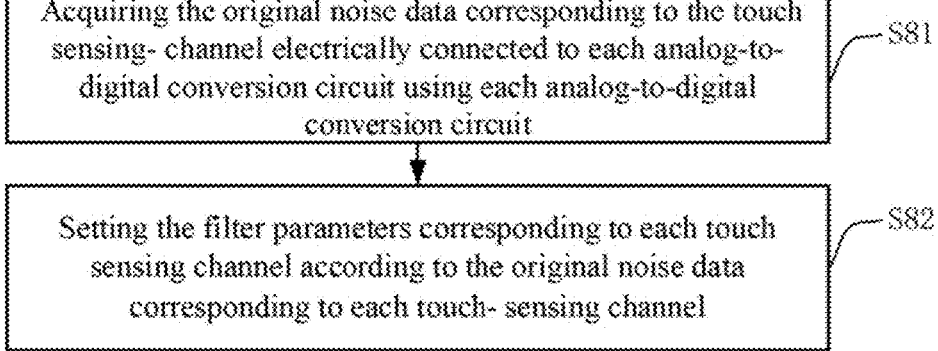
FIG. 8 illustrates a flow chart of an exemplary touch control testing method according to various disclosed embodiments of the present disclosure.

FIG. 8 illustrates a flow chart of an exemplary touch control testing method according to various disclosed embodiments of the present disclosure. As shown in FIG. 8, the touch control testing method of a touch chip may include S81-S82:

S81: acquiring the original noise data corresponding to the touch-sensing channel electrically connected to each analog-to-digital conversion circuit using each analog-to-digital conversion circuit; and S82: setting the filter parameters corresponding to each touch-sensing channel according to the original noise data corresponding to each touch-sensing channel.

The specific implementation of each of the above steps will be described below.

According to the embodiments of the present disclosure, because each touch-sensing channel may individually correspond to an analog-to-digital conversion circuit, the original noise data corresponding to each touch-sensing channel may be acquired separately during the testing, and the corresponding filtering parameters may be set for each touch-sensing channel according to the original noise data corresponding to each touch-sensing channel such that a better filtering effect may be achieved for each touch-sensing channel, thus optimizing the noise reduction capability of the touch chip.

For S81, the original raw noise data may refer to the noise that has not been processed by the touch chip algorithm.

When acquiring the original noise data corresponding to the touch-sensing channel, the filtering algorithm of the touch chip may be turned off. For example, if the filtering algorithm of the touch chip is implemented based on the analog-to-digital conversion circuit ADC, the filtering function of the analog-to-digital conversion circuit ADC may be turned off when acquiring the raw noise data.

In one embodiment, the original raw noise data may be acquired in real-time and stored in the touch chip.

Figure 9:
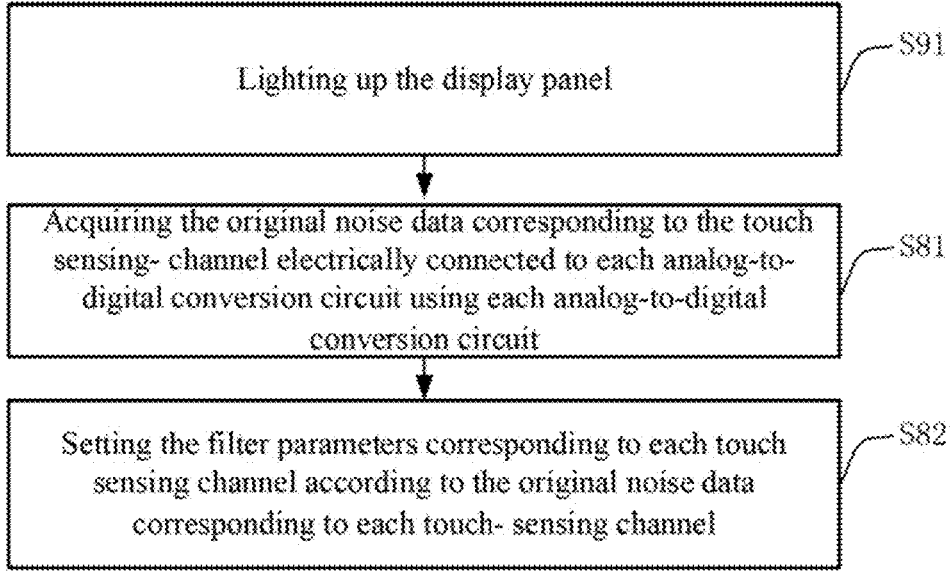
FIG. 9 illustrates a flow chart of another exemplary touch control testing method according to various disclosed embodiments of the present disclosure.

In some embodiments, as shown in FIG. 9, before S81, the touch control testing method provided by the embodiment of the present disclosure may also include S91:

S91: lighting up the touch display panel.

For the touch control, the main source of noise interference may lie in the interference of display signals. According to embodiments of the present disclosure, original noise data may be acquired when the touch display panel is in a display state, and the filtering parameters generated based on the original noise data may more effectively filter out interference caused by the display signal.

When the interference source is caused by other circumstances, the original noise data acquisition environment may also be set according to actual needs.

For S82, for each touch-sensing channel, appropriate filter parameters may be set according to the original noise data corresponding to the touch-sensing channel. For example, the corresponding initial filtering parameters may be set based on the original noise data, then the filtering process may be performed based on the initial filtering parameters, and the filtering effect may be checked. If the filtering effect does not meet the requirements, the initial filtering parameters may be adjusted, then the filter processing may be performed based on the adjusted filtering parameters, and the filtering effect may be checked until the filtering effect based on the adjusted filtering parameters meets the requirements, and the adjusted filtering parameters may be used as the final appropriate filtering parameters.

There may not be a certain rule in the corresponding relationship between the original noise data and the filtering parameters. For example, the larger the original noise data, the larger the corresponding filtering parameters may not necessarily be. The filtering parameters may be generated based on the characteristics of the original noise data.

As introduced above, the original noise data of touch display panels under different working conditions may be different. To achieve better filtering effects under different working conditions, in some embodiments, the touch control testing method provided by the embodiments of the present disclosure may also include: obtaining the corresponding original noise data of the touch display panels under different working conditions; and setting the filtering parameters corresponding to the touch display panels under different working conditions according to the corresponding original noise data of the touch display panels under different working conditions.

In one embodiment, the mapping relationship between multiple original noise data and multiple filtering parameters may be realized through a mapping circuit.

According to the embodiments of the present disclosure, filtering parameters corresponding to the touch display panels under different working conditions may be generated based on the corresponding original noise data of the touch display panels under different working conditions. In such a way, during the FW debugging, the touch chip may set the filtering parameters corresponding to different working conditions according to the original noise data corresponding to the touch display panel under different working conditions such that a better filtering effect may be achieved for each working condition, which may help to improve production line yield and the touch control performance of the entire device.

In some embodiments, the original noise data of the same touch-sensing channel under different working conditions may also be acquired, and based on the original noise data of the same touch-sensing channel under different working conditions, the filter parameters of the same touch-sensing channel under different working conditions may be set.

In some embodiments, different working conditions in the above steps may include working conditions in which the refresh frequencies of the display screen of the touch display panels are different. Of course, according to actual needs, different working conditions may also refer to working conditions with different brightness of the touch display panel or other working conditions.

Taking the condition that the different working conditions mean the refresh frequencies are different as an example, first, the touch display panel may be lit and the touch display panel may be controlled to refresh the screen at the first refresh frequency; each analog-to-digital conversion circuit may be used to collect the power of each analog-to-digital conversion circuit; and the original noise data corresponding to the connected touch-sensing channel at the first refresh frequency; and the filtering parameters corresponding to each touch-sensing channel at the first refresh frequency may be set. Then, the touch display panel may be controlled to refresh the image at a second refresh frequency; each analog-to-digital conversion circuit may be used to acquire the original noise data corresponding to the touch sensing channel electrically connected to each analog-to-digital conversion circuit at the second refresh frequency; and then the corresponding filtering parameters of each touch-sensing channel at the second refresh frequency may be set.

In some embodiments, the touch control testing method provided by the embodiments of the present disclosure may further include burning the generated filtering parameters into the memory of the touch chip. In this way, the filtering parameters may be called directly by FW.

It should be noted that the application scenarios described in the embodiments of the present disclosure are for the purpose of more clearly explaining the technical solutions of the embodiments of the present disclosure, and do not constitute a limitation on the technical solutions provided by the embodiments of the present disclosure. Those of ordinary skill in the art will know that with the emergence of new application scenarios, the technical solutions provided by the embodiments of this disclosure are also applicable to similar technical problems.

Additionally, the present disclosure is not limited to the specific configurations and processes described above and illustrated in the figures. For the sake of brevity, detailed descriptions of known methods are omitted here. In the above embodiments, several specific steps are described and shown as examples. However, the method process of the present disclosure is not limited to the specific steps described and shown. Those skilled in the art can make various changes, modifications and additions, or change the order between steps after understanding the spirit of the present disclosure.

Figure 10:
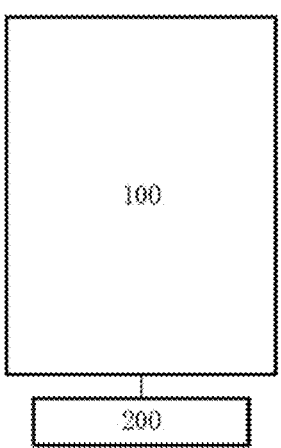
FIG. 10 illustrates an exemplary electronic device according to various disclosed embodiments of the present disclosure.

The present disclosure also provides an electronic device. FIG. 10 illustrates a schematic structural diagram of an exemplary electronic device according to various disclosed embodiments of the present disclosure. As shown in FIG. 10, the electronic device provided by the embodiment of the present disclosure may include a touch display panel 100 and a touch chip 200. The touch chip 200 may be the touch chip described in any of the above embodiments.

The electronic device provided by the embodiment of the present disclosure may include the beneficial effects of the touch chip provided by the embodiment of the present disclosure. The details may be referred to the specific description of the touch chip in the above embodiments, and this embodiment will not be described again here.

The embodiment in FIG. 10 only takes a mobile phone as an example to illustrate the electronic device. It can be understood that the electronic device provided by the embodiment of the present disclosure may be wearable products, computers, televisions, vehicle-mounted display devices and other devices with display functions and electronic equipment with touch functions, this disclosure does not impose specific restrictions on this.

Embodiments of the present disclosure also provide a computer-readable storage medium. A computer program may be stored on the computer-readable storage medium. When the computer program is executed by a processor, the touch control testing method in the above embodiments may be implemented and the same may be achieved. The technical effects will not be repeated here to avoid repetition. The computer-readable storage medium may include read-only memory (ROM), random access memory (RAM), magnetic disks or optical disks, and is not limited here.

Embodiments of the present disclosure also provide a computer program product. The computer program product may include computer program instructions. When the computer program instructions are executed by a processor, the touch control testing method in the above embodiments may be implemented and the same technical effect may be achieved. To avoid repetition, they will not be repeated here.

According to the above-described embodiments of the present disclosure, these embodiments do not exhaustively describe all the details, nor do they limit the disclosure to the specific embodiments described. Obviously, many modifications and variations are possible in light of the above description. This specification selects and specifically describes these embodiments to better explain the principles and practical applications of the present disclosure, so that those skilled in the art can make good use of the present disclosure and make modifications based on the present disclosure. This disclosure may be limited only by the claims and their full scope and equivalents.

What is claimed is:

1. A touch chip applied to a touch display panel including a plurality of touch-sensing channels, comprising:
   a plurality of analog-to-digital conversion circuits electrically connected to the plurality of touch-sensing channels of the touch display panel in one-to-one correspondence;
   an operation amplifier circuit, wherein an input terminal of the operation amplifier circuit is electrically connected to a touch-sensing channel of the plurality of touch-sensing channels and the operation amplifier circuit is configured to convert a current signal from the touch-sensing channel into a voltage signal; and a demodulator, wherein an input terminal of the demodulator is electrically connected to an output terminal of the operation amplifier circuit, and the demodulator is configured to restore a low-frequency digital signal modulated in a high-frequency digital signal, wherein filtering parameters corresponding to a same touch-sensing channel of the plurality of touch-sensing channels under different working conditions are different.

2. The touch chip according to claim 1, further comprising:

a mapping circuit electrically connected between the plurality of analog-to-digital conversion circuits and the plurality of touch-sensing channels, and including a plurality of mapping relationships between original noise data and filtering parameters.

3. The touch chip according to claim 2, wherein:

the mapping circuit is configured to generate filtering parameters corresponding to the touch display panel under the different working conditions based on original noise data corresponding to the touch display panel under the different working conditions.

4. The touch chip according to claim 2, wherein:

the plurality of touch-sensing channels and the plurality of analog-to-digital conversion circuits share the mapping circuit.

5. The touch chip according to claim 4, wherein:

the different working conditions include working conditions under which refresh frequencies of displayed images of the touch display panel are different.

6. The touch chip according to claim 2, further comprising:

a filter, wherein an input terminal of the filter is electrically connected to an output terminal of the demodulator and the filter is configured for filtering signals; and a holder, wherein an input terminal of the holder is electrically connected to an output terminal of the filter, an output terminal of the holder is electrically connected to an input terminal of an analog-to-digital conversion circuit of the plurality of analog-to-digital conversion circuits, and the holder is configured to control an output signal of the analog-to-digital conversion circuit to change following an analog input voltage.

7. The touch chip according to claim 6, wherein:

the mapping circuit is electrically connected between the filter and holder.

8. The touch chip according to claim 1, further comprising:

a memory configured to store filtering parameters corresponding to each of the plurality of touch-sensing channels.

9. A method for testing a touch chip, comprising:

providing the touch chip including a plurality of analog-to-digital conversion circuits electrically connected to a plurality of touch-sensing channels of a touch display panel in one-to-one correspondence;

providing an operation amplifier circuit, wherein an input terminal of the operation amplifier circuit is electrically connected to a touch-sensing channel of the plurality of touch-sensing channels and the operation amplifier circuit is configured to convert a current signal from the touch-sensing channel into a voltage signal;

providing a demodulator, wherein an input terminal of the demodulator is electrically connected to an output terminal of the operation amplifier circuit, and the demodulator is configured to restore a low-frequency digital signal modulated in a high-frequency digital signal, acquiring original noise data corresponding to a touch-sensing channel of the plurality of touch-sensing channels that is electrically connected to each of the plurality of analog-to-digital conversion circuits using each of the plurality of analog-to-digital conversion circuits;

setting filter parameters corresponding to each of the plurality of touch-sensing channels according to the original noise data corresponding to each of the plurality of touch-sensing channels; and setting filtering parameters corresponding to a same touch-sensing channel of the plurality of touch-sensing channels under different working conditions to be different.

10. The method according to claim 9, wherein, before acquiring the original noise data corresponding to the touch-sensing channel of the plurality of touch-sensing channels that is electrically connected to each of the plurality of analog-to-digital conversion circuits using each of the plurality of analog-to-digital conversion circuits, the method further comprises:

lighting up the touch display panel.

11. The method according to claim 9, further comprising:

acquiring original noise data corresponding to the touch display panel under each of the different working conditions; and setting filtering parameters corresponding to the touch display panel under each of the different working conditions according to the original noise data corresponding to the touch display panel under each of the different working conditions.

12. The method according to claim 11, wherein:

the different working conditions include working conditions under which refresh frequencies of displayed images of the touch display panel are different.

13. The method according to claim 12, further comprising:

burning the filtering parameters into a memory of the touch chip.

14. An electronic device, comprising:

a touch display panel; and a touch chip including a plurality of analog-to-digital conversion circuits electrically connected to a plurality of touch-sensing channels of the touch display panel in one-to-one correspondence;

an operation amplifier circuit, wherein an input terminal of the operation amplifier circuit is electrically connected to a touch-sensing channel of the plurality of touch-sensing channels and the operation amplifier circuit is configured to convert a current signal from the touch-sensing channel into a voltage signal; and a demodulator, wherein an input terminal of the demodulator is electrically connected to an output terminal of the operation amplifier circuit, and the demodulator is configured to restore a low-frequency digital signal modulated in a high-frequency digital signal, wherein filtering parameters corresponding to a same touch-sensing channel of the plurality of touch-sensing channels under different working conditions are different.

* * * * *